(12) United States Patent
Obata et al.

(10) Patent No.: US 9,660,420 B2
(45) Date of Patent: May 23, 2017

(54) LASER DIODE

(71) Applicant: Sony Corporation, Tokyo (JP)

(72) Inventors: Toshiyuki Obata, Miyagi (JP); Hidekazu Kawanishi, Miyagi (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/746,216

(22) Filed: Jun. 22, 2015

(65) Prior Publication Data

US 2015/0295387 A1 Oct. 15, 2015

Related U.S. Application Data

(63) Continuation of application No. 13/067,595, filed on Jun. 13, 2011, now Pat. No. 9,112,333.

(30) Foreign Application Priority Data

Jul. 6, 2010 (JP) .................. 2010-153770

(51) Int. Cl.
*H01S 5/00* (2006.01)
*H01S 5/343* (2006.01)
*B82Y 20/00* (2011.01)
*H01S 5/30* (2006.01)
(Continued)

(52) U.S. Cl.
CPC .......... *H01S 5/34333* (2013.01); *B82Y 20/00* (2013.01); *H01S 5/2018* (2013.01); *H01S 5/2205* (2013.01); *H01S 5/305* (2013.01); *H01S 5/3063* (2013.01); *H01S 5/2009* (2013.01);
(Continued)

(58) Field of Classification Search
CPC .. H01S 5/34333; H01S 5/3063; H01S 5/2018; H01S 5/2205; H01S 5/305; H01S 5/2214; H01S 5/2009; H01S 2304/04; H01S 5/22; B82Y 20/00
See application file for complete search history.

(56) References Cited

U.S. PATENT DOCUMENTS 5,555,271 A * 9/1996 Honda .................. B82Y 20/00
372/45.01
6,606,335 B1 8/2003 Kuramata et al.
7,183,569 B2 2/2007 Okumura
(Continued)

FOREIGN PATENT DOCUMENTS

JP 09-045989 2/1997
JP 2000-151023 5/2000
(Continued)

*Primary Examiner* — Yuanda Zhang
(74) *Attorney, Agent, or Firm* — Michael Best & Friedrich LLP

(57) ABSTRACT

A laser diode with an improved kink level in the L-I characteristic and capable of obtaining a stable high output in a horizontal transverse mode is provided. The laser diode includes an active layer made of nitride III-V compound semiconductor containing at least gallium (Ga) in 3B-group elements and at least nitrogen (N) in 5B-group elements, an n-type compound semiconductor layer provided on one of faces of the active layer, and a p-type compound semiconductor layer provided on the other face of the active layer. A region closest to the active layer, in the n-type compound semiconductor layer is a high-concentration region whose impurity concentration is higher than that of the other n-type regions.

15 Claims, 3 Drawing Sheets

(51) Int. Cl.
*H01S 5/20* (2006.01)
*H01S 5/22* (2006.01)

(52) U.S. Cl.
CPC .............. *H01S 5/22* (2013.01); *H01S 5/2214* (2013.01); *H01S 2304/04* (2013.01)

(56) References Cited

U.S. PATENT DOCUMENTS

| | | | |
|---|---|---|---|
| 2002/0123166 A1* | 9/2002 | Hasegawa | H01L 21/02458 438/46 |
| 2005/0117618 A1 | 6/2005 | Tredicucci et al. | |
| 2005/0121679 A1 | 6/2005 | Nagahama et al. | |
| 2006/0027814 A1 | 2/2006 | Watanabe et al. | |
| 2007/0171948 A1 | 7/2007 | Shigihara et al. | |
| 2008/0175293 A1 | 7/2008 | Tanaka | |
| 2008/0247435 A1 | 10/2008 | Choi | |
| 2009/0161711 A1* | 6/2009 | Kubota | 372/43.01 |
| 2010/0027573 A1* | 2/2010 | Yokoyama | H01S 5/06216 372/38.02 |
| 2010/0150194 A1 | 6/2010 | Tsuchiya et al. | |
| 2010/0290496 A1* | 11/2010 | Takayama | H01S 5/32341 372/46.012 |

FOREIGN PATENT DOCUMENTS

| | | |
|---|---|---|
| JP | 2000-174342 | 6/2000 |
| JP | 2001-102675 | 4/2001 |
| JP | 2010-272593 | 12/2010 |

\* cited by examiner

LASER DIODE

CROSS REFERENCES TO RELATED APPLICATIONS

This is a Continuation of application Ser. No. 13/067,595, filed on Jun. 13, 2011, which contains subject matter related to Japanese Patent Application JP 2010-153770, filed in the Japanese Patent Office on Jul. 6, 2010, the entire contents of which are incorporated herein by reference.

BACKGROUND

The present disclosure relates to a edge-emitting laser diode.

In recent years, a blue-violet laser diode using a nitride compound semiconductor is widely used as a light source for a high-capacity optical disk, and a very-reliable device with a higher output is being developed. In an edge emitting laser diode of this kind, however, induced emission occurs strongly in the center of an NFP (Near Field Pattern) where the light emission intensity is the highest. Consequently, a phenomenon (hole burning) that carriers injected in the center of the NFP recombine particularly quickly and gain is saturated occurs. When such a hole burning phenomenon occurs, the horizontal transverse mode becomes unstable, it causes decrease in the kink level in the L-I (Light output-Injection current) characteristic. Such a drawback occurs not only in a laser diode of a gain guide structure but also in a laser diode of an index guide structure. Therefore, when the kink level decreases, a stable high-output laser diode is not realized.

As a method of stabilizing the horizontal transverse mode, two methods are employed in a ridge laser diode. In the first method, by decreasing the width of a stripe (current path), carriers are diffused from the end of the stripe to a center part to thereby suppress hole burning. In the second method, by increasing a light loss on the side of the ridge, a high-order horizontal transverse mode is prevented from having a gain.

SUMMARY

The first method, however, has a drawback such that, by decreasing the stripe width, the drive voltage increases and pulsation occurs. It also has a drawback such that it is difficult to control the stripe width at the time of manufacture. On the other hand, the second method has a drawback such that power consumption increases at the time of high temperature and high output due to increase in light loss and reliability deteriorates due to heat generation. Consequently, a method of improving the kink level other than the above-described methods is being demanded to realize a high-output laser diode having a stable horizontal transverse mode.

In relation to the disclosure, Japanese Unexamined Patent Application Publication Nos. H09-45989 and 2000-174342 disclose techniques of making impurity concentration uneven. In Japanese Unexamined Patent Application Publication No. H09-45989, a low-concentration doped region of $3 \times 10^{17}$ $cm^{-3}$ or less is necessary in a cladding layer second closest to an active layer, and the semiconductor material is limited to AlGaAs. Since Japanese Unexamined Patent Application Publication No. 2000-174342 is directed to improve crystallinity of an epitaxial layer in a light emitting element on a substrate of a different kind, a cladding layer of generating initial, that is, a layer which is furthest from an active layer is demanded to be undoped, and it is different from the present disclosure. The techniques are not replacing the first and second methods and do not realize a high-output laser diode with a stabilized horizontal transverse mode.

It is therefore desirable to provide a laser diode with an improved kink level in the L-I characteristic and capable of obtaining a stable high output in a horizontal transverse mode.

A laser diode according to an embodiment of the disclosure includes an active layer made of nitride III-V compound semiconductor containing at least gallium (Ga) in 3B-group elements and at least nitrogen (N) in 5B-group elements, an n-type compound semiconductor layer provided on one of faces of the active layer, and a p-type compound semiconductor layer provided on the other face of the active layer. A region closest to the active layer, in the n-type compound semiconductor layer is a high-concentration region whose impurity concentration is higher than that of the other n-type regions.

A concrete impurity concentration in the high-concentration region lies within a range from $3 \times 10^{18}$ $cm^{-3}$ to $1 \times 10^{21}$ $cm^{-3}$ both inclusive.

In the laser diode according to an embodiment of the disclosure, by the existence of a high-concentration region on the side close to the active layer in the n-type layer, the hole burning phenomenon in an NFP center portion is suppressed, and the kink level of the L-I characteristic improves.

According to the laser diode of the embodiment of the present disclosure, by setting a region closest to an active layer, in an n-type compound semiconductor layer to a high-concentration region whose impurity concentration is higher than that of the other n-type regions, the kink level of the L-I characteristic improves, and a high-output laser diode with a stable horizontal transverse mode is realized.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION OF THE PREFERRED EMBODIMENTS

Modes for carrying out the present disclosure will be described in detail below with reference to the drawings. The description will be given in the following order.
1. Embodiment (blue-violet laser diode)
2. Modification

[Embodiment]

Figure 1:
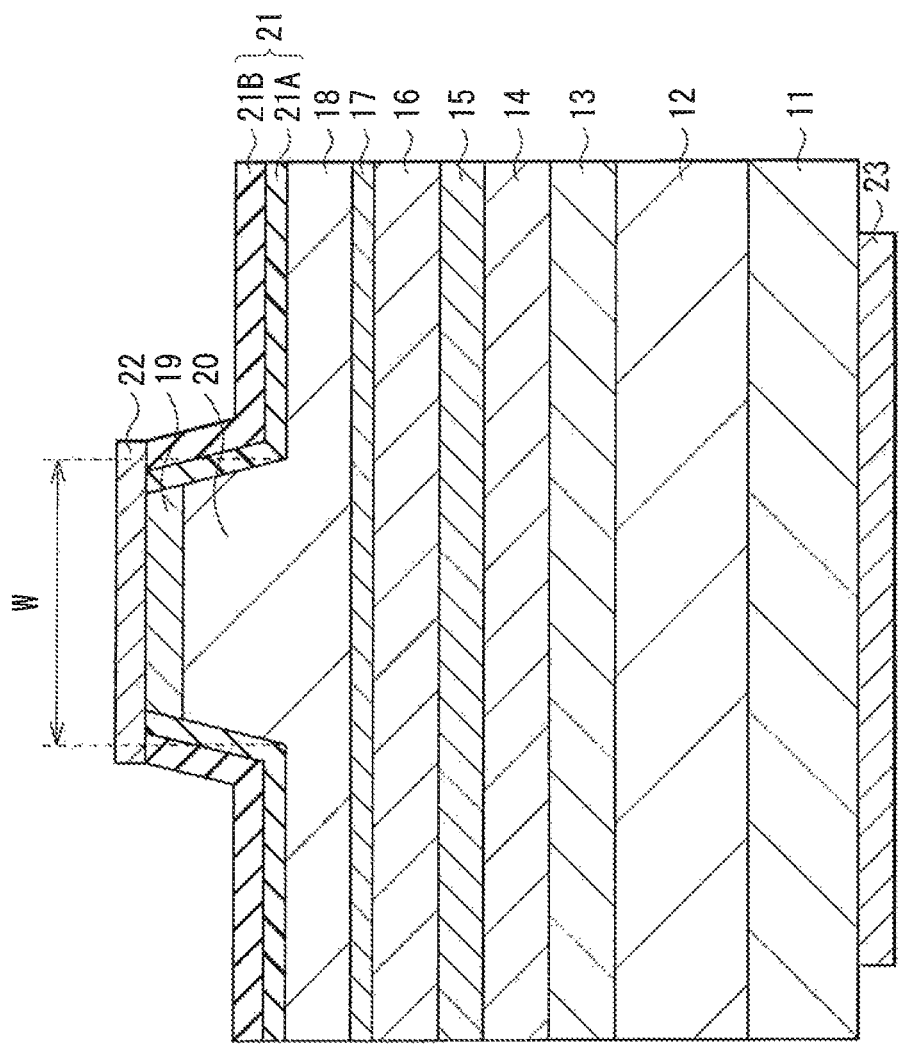
FIG. 1 is a cross section illustrating a structure of a laser diode according to an embodiment of the present disclosure.

FIG. 1 illustrates a vertical-sectional structure of an edge-emitting laser diode according to an embodiment of the present disclosure. The laser diode is, for example, a blue-violet laser diode of about 400 nm used as, for example, a laser for reproducing or recording/reproducing a BD of a personal computer, a home-use game machine, or the like. The laser diode has a structure in which, for example, an n-type cladding layer 12, an n-type guide layer 13, an i-type guide layer 14, an active layer 15, an i-type guide layer 16, an electronic barrier layer 17, a p-type superlattice cladding layer 18, and a p-side contact layer 19 are stacked in this order on a top face side of a substrate 11 made of n-type GaN with a buffer layer (not illustrated) in between.

The substrate 11 is made of, for example, GaN to which silicon (Si) or oxygen (O) is added as n-type impurity. The buffer layer has, for example, a thickness of 0.5 μm and is made of n-type GaN to which silicon (Si) is added as an n-type impurity.

The n-type classing layer 12 is made of, for example, GaN having a thickness of 0.1 μm and to which an n-type impurity is added. The n-type guide layer 13 is made of, for example, AlGaN (Al content is, for example, 6.5%) having a thickness of 2 μm and to which an n-type impurity is added. For example, the n-type impurity is a 4-group or 6-group material such as silicon (Si), oxygen (O), germanium (Ge), selenium (Se), or sulfur (S).

In the embodiment, the n-type guide layer 13 closest to the active layer 15 side in the n-type layers between the substrate 11 and the active layer 15 is a high-concentration region whose impurity concentration is higher than the n-type cladding layer 12 far from the active layer 15, thereby improving the kink level. The reason will be described later.

Figure 2:
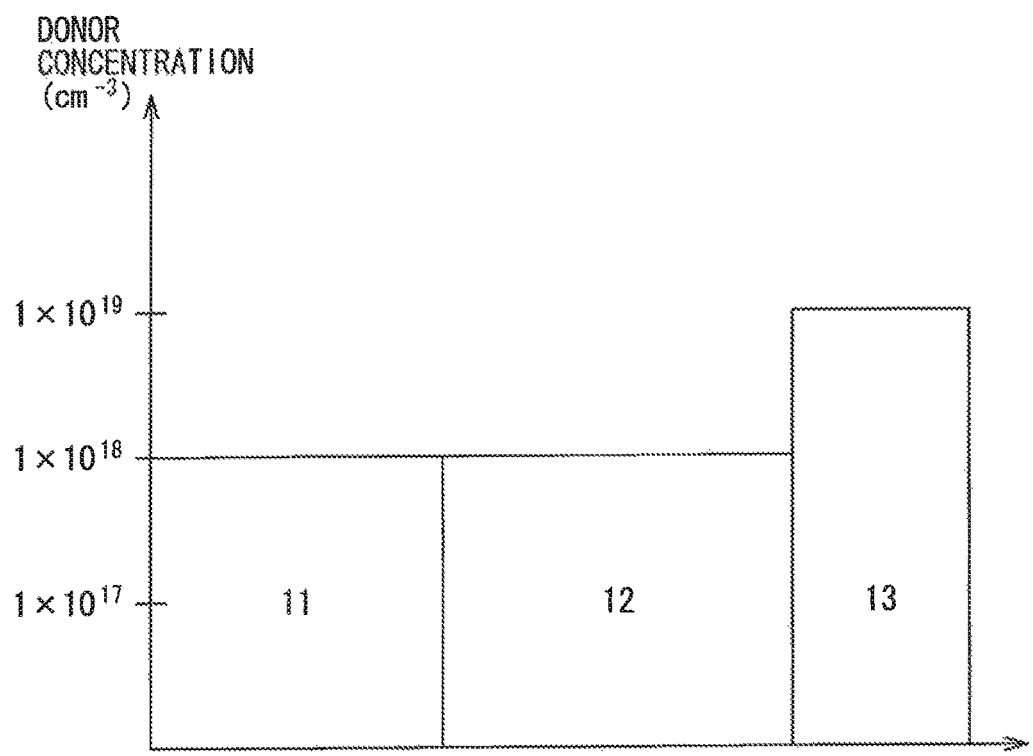
FIG. 2 is a diagram illustrating a doping profile of n-type layers in the laser diode of FIG. 1.

FIG. 2 illustrates an example of a concentration profile of the n-type impurities in the substrate 11, the n-type cladding layer 12, and the n-type guide layer 13. The n-type impurity concentration in the substrate 11 and the n-type cladding layer 12 is about $1 \times 10^{18}$ cm$^{-3}$ and, the n-type impurity concentration in the n-type guide layer 13 is, for example, about $1 \times 10^{19}$ cm$^{-3}$. It is sufficient that the n-type impurity concentration of the n-type guide layer 13 be higher than that of the n-type cladding layer 12. Preferably, the n-type impurity concentration of the n-type guide layer 13 is in the range from $3 \times 10^{18}$ cm$^{-3}$ to $1 \times 10^{21}$ cm$^{-3}$ both inclusive. When it is less than $3 \times 10^{18}$ cm$^{-3}$, the effect of kink suppression is not displayed. When it is higher than $1 \times 10^{21}$ cm$^{-3}$, formation of mixed crystal or crystallinity may deteriorate. More preferably, the n-type impurity concentration of the n-type guide layer 13 is in the range from $5 \times 10^{18}$ cm$^{-3}$ to $1 \times 10^{21}$ cm$^{-3}$ both inclusive. In the range, an effect of increasing the doping concentration is sufficiently displayed, and deterioration in formation of mixed crystal or crystallinity is suppressed.

The i-type guide layers 14 and 16 have the function of optical confinement. The i-type guide layer 14 has, for example, a thickness of 0.010 μm and is made of $Ga_xIn_{1-x}N$ (where x≥0) which is undoped with impurity. The active layer 15 has, for example, a thickness of 0.056 μm and has a multiple quantum well structure of a well layer and a barrier layer made of GaxIn1−xN (where x≥0) of different compositions.

The i-type guide layer 16 has, for example, a thickness of 0.010 μm and is made of $Ga_xIn_{1-x}N$ (where x≥0) which is undoped with impurity. The electronic barrier layer 17 has, for example, a thickness of 20 nm and is made of p-type AlGaN (Al content is, for example, 16%) doped with magnesium (Mg) as a p-type impurity. The p-type superlattice cladding layer 18 has, for example, a superlattice structure in which a p-type AlGaN layer doped with magnesium (Mg) as a p-type impurity and having a thickness of 2.5 nm, and a p-type GaN layer doped with magnesium (Mg) as a p-type impurity and having a thickness of 2.5 nm are alternately stacked. The p-type superlattice cladding layer 18 may have a modulated doping structure of only an AlGaN layer or a GaN layer. The p-side contact layer 19 has, for example, a thickness of 0.10 μm and is made of p-type GaN doped with magnesium (Mg) as a p-type impurity.

By a part of the p-type superlattice cladding layer 18 and the p-side contact layer 19, a narrow-striped ridge 20 extended in the resonator direction for current confinement is formed. The stripe region in the active layer 15 corresponding to the ridge 20 is a light emission region (current injection region). A p-side electrode 22 is formed over the p-type superlattice cladding layer 18 and the p-side contact layer 19 with a buried layer 21 having a layer stack structure of a $SiO_2$ layer 21A and a Si layer 21B in between. The p-side electrode 22 has, for example, a structure in which palladium (Pd), platinum (Pt), and gold (Au) are sequentially stacked from the p-side contact layer 19 side and is electrically connected to the p-type superlattice cladding layer 18 with the p-side contact layer 19 in between. The p-side electrode 22 extends in a strip shape so as to confine current, and the region in the active layer 15 corresponding to the p-side electrode 22 is a light emission region. On the other hand, an n-side electrode 23 is formed on the back side of the substrate 11. The n-side electrode 23 has, for example, a structure in which titanium (Ti), platinum (Pt), and gold (Au) are sequentially stacked and is electrically connected to the n-type cladding layer 12 with the substrate 11 and a buffer layer (not illustrated) in between.

In the laser diode, for example, a pair of side faces opposed to each other in the longitudinal direction of the p-side electrode 22 serves as a pair of resonator end faces. A pair of reflector films which are not illustrated is formed on the pair of resonator end faces. The reflectance of one of the pair of reflector films is adjusted to be low, and that of the other reflector film is adjusted to be high. With the configuration, light generated in the active layer 15 reciprocates between the pair of reflector films and is amplified, and the resultant amplified light goes out as a laser beam from one of the reflector films.

Figure 3:
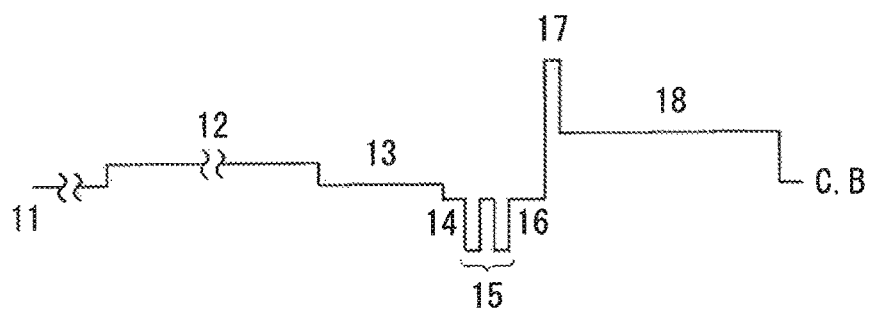
FIG. 3 is a diagram illustrating a band profile of a conduction band.

FIG. 3 illustrates a flat band diagram in a conduction band of the laser diode. The band gap in the n-type guide layer 13 having high impurity concentration is smaller than that in the n-type cladding layer 12 having low impurity concentration and is larger than that in the i-type guide layer 14. The laser diode has an SCH (Separate Confinement Heterostructure) in which the refractive index of the n-type guide layer 13 is higher than that of the n-type cladding layer 12. Since confinement of carriers and confinement of light are separated from each other, a stable light output is obtained.

For example, the laser diode may be manufactured as follows.

First, the substrate 11 made of, for example, GaN is prepared, and a buffer layer made of the above-described material is grown on the surface of the substrate 11 at a growth temperature of, for example, 1,050° C. by the MOCVD (Metal Organic Chemical Vapor Deposition). At the same growth temperature of 1,050° C., the n-type cladding layer 12 made of the above-described material is grown by the MOCVD. After that, by the MOCVD, the n-type guide layer 13, the i-type guide layer 14, the active layer 15, the i-type guide layer 16, the electronic barrier layer 17, the p-type superlattice cladding layer 18, and the p-side contact layer 19 are grown in order. The relation of the impurity concentrations of the n-type cladding layer 12 and the n-type guide layer 13 is as described above.

At the time of performing the MOCVD, for example, trimethyl gallium ($(CH_3)_3Ga$) is used as the material gas of gallium, trimethyl aluminum ($(CH_3)_3Al$) is used as the material gas of aluminum, and trimethyl indium ($(CH_3)_3In$) is used as the material gas of indium. As the material gas of nitrogen, ammonia ($NH_3$) is used. As the material gas of silicon, monosilane ($SiH_4$) is used. As the material gas of magnesium, bis(cyclopentadienyl) magnesium ($(C_5H_5)_2Mg$) is used.

Subsequently, a not-illustrated mask is formed on the p-side contact layer 19. Using the mask, for example, by RIE (Reactive Ion Etching), a part of the p-side contact layer 19 and the p-type superlattice cladding layer 18 is selectively removed. By the RIE, the upper part of the p-type superlattice cladding layer 18 and the p-side contact layer 19 are formed as the narrow-strip-shaped ridge 20.

The buried layer 21 made of the above-described material is formed on the p-type superlattice cladding layer 18 and the p-side contact layer 19. An opening is formed in the buried layer 21 in correspondence with the top face of the ridge 20, and the p-side electrode 22 is formed. Further, the thickness of the substrate 11 is set to, for example, about 100 μm by lapping or polishing the rear face side of the substrate 11 and, after that, the n-side electrode 23 is formed on the rear face of the substrate 11. After that, the substrate 11 is adjusted in a predetermined size, and a not-illustrated reflector film is formed on the pair of resonator end faces which are opposed to each other. As a result, the edge-emitting laser diode illustrated in FIG. 1 is completed.

In the laser diode of the embodiment, when predetermined voltage is applied across the p-side electrode 22 and the n-side electrode 23, current is injected in the active layer 15, and light is generated by electron-hole recombination. The light is reflected by the pair of reflector films and reciprocates between the films, laser oscillation occurs, and the resultant is emitted as a laser beam to the outside.

As described above, in the laser diode, it is known that parameters for controlling the kink level are width (W in FIG. 1) of the stripe (current path) and distance "d" from the active layer on the side of the ridge to the loss layer (the Si layer 21B in FIG. 1), and it is effective to adjust the width and the distance "d". The methods, however, have drawbacks of rise in the drive voltage, increase in power consumption, and the like.

In contrast, in the embodiment, the impurity concentration of the n-type guide layer 13 close to the active layer 15 among the n-type layers is set to be higher than that of the n-type cladding layer 12 far from the active layer 15. By setting the impurity concentration of the n-type guide layer 13 close to the active layer 15 to be higher as described above, more preferably, to be three times as high as that of the n-type cladding layer 12, the carrier injection efficiency increases, and the hole burning is suppressed, so that the kink level improves.

Figure 4:
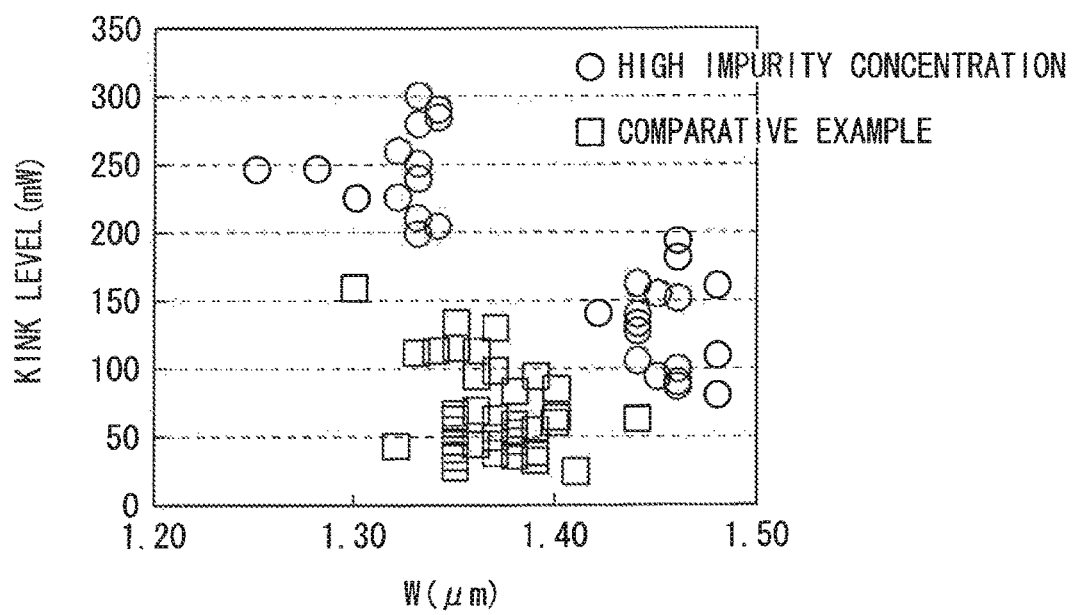
FIG. 4 is a diagram illustrating stripe width dependency of a kink level.

FIG. 4 illustrates the effect (stripe width dependency) on the kink level in the case where, in the laser diode having the above-described structure, silicon (Si) is added as an example of the n-type impurity of the n-type cladding layer 12 and the n-type guide layer 13, the concentration of the n-type cladding layer 12 is set to $1\times10^{18}$ $cm^{-3}$ and that of the n-type guide layer 13 is set to $1\times10^{19}$ $cm^{-3}$ (circle in FIG. 4). As a comparative example, results of the case where both of the concentrations of the n-type cladding layer 12 and that of the n-type guide layer 13 are set to $1\times10^{18}$ $cm^{-3}$ (square in FIG. 4).

As obvious from FIG. 4, in comparison to the comparative example in which the n-type layer has the uniform concentration profile, in the embodiment in which the n-type guide layer 13 is set as the high-concentration region, the kink level improves even in the wide stripe width (W=1.40 to 1.50 μm), stable operation is achieved. That is, it is understood that the kink level is improved without a measure such as narrowing of the stripe width or the like in related art.

In the embodiment as described above, the n-type guide layer 13 close to the active layer 15 in the n-type layers is set to be the high-concentration region whose impurity concentration is higher than the n-type cladding layer 12 far from the active layer 15, so that the kink level of the L-I characteristic improves. Therefore, the laser diode of a high output, having the stable horizontal transverse mode is realized.

In the embodiment, the kink level is improved without using a method such as narrowing of the stripe width like in related art, so that the margin of productivity is enlarged, and the device characteristics which were sacrificed by suppression of kink are improved. In addition, in the embodiment, it is sufficient to simply increase the doping concentration of a part of the n-type layer, so that the disclosure is realized without changing the manufacturing process in related art.

Figure 5:
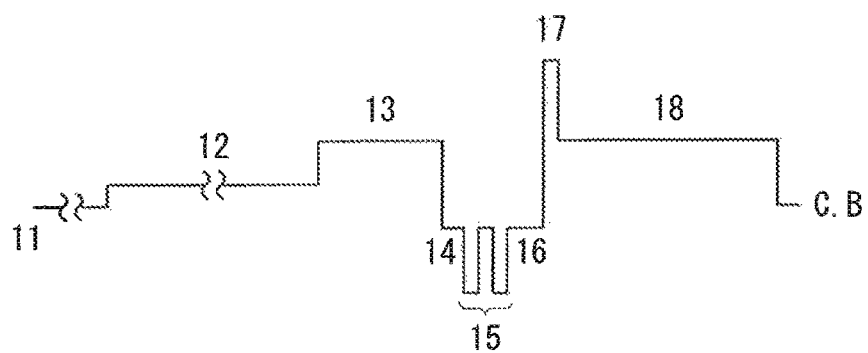
FIG. 5 is a diagram illustrating a band profile of a laser diode of a modification.

Although the present disclosure has been described above by the embodiment, the disclosure is not limited to the embodiment but may be variously modified. For example, in the foregoing embodiment, the band gap in the n-type guide layer 13 close to the active layer 15 is set to be smaller than that in the n-type cladding layer 12. However, the disclosure is not limited to the embodiment. As illustrated in the flat band diagram of FIG. 5, the band gap in the n-type guide layer 13 close to the active layer 15 may be set to be larger than that in the n-type cladding layer 12. To change the size of the band gap, it is sufficient to change, for example, the content of the aluminum (Al) contained in the n-type cladding layer 12 and the n-type guide layer 13.

Although the high-concentration region is set to the n-type guide layer in the foregoing embodiment, the guide layer may not be provided and a partial region on the side closer to the active layer, in the n-type cladding layer may be set to the high-concentration region.

Further, the materials of the layers are not limited to those in the foregoing embodiment. Other nitride III-V compound semiconductors containing at least gallium (Ga) in 3B-group elements and at least nitrogen (N) in 5B-group elements may be used. The composition ratio and thickness of each layer, the film forming method, and the like may be similarly changed. For example, although the case of forming the layers from the buffer layer to the p-side contact layer 19 by the MOCVD has been described in the foregoing embodiment, the layers may be formed by another metal organic chemical vapor deposition such as HVPE, or the MBE (Molecular Beam Epitaxy) or the like.

In addition, although the laser diode of the gain guide structure has been described in the foregoing embodiment, the disclosure is also applicable to a laser diode of the index guide structure.

The present disclosure contains subject matter related to that disclosed in Japanese Priority Patent Application JP 2010-153770 filed in the Japan Patent Office on Jul. 6, 2010, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A laser diode comprising:
   a p-type compound semiconductor layer that includes a ridge;
   an n-type compound semiconductor layer that includes a buffer layer, an n-type cladding layer, and an n-type guide layer; and
   an active layer between the p-type compound semiconductor layer and the n-type compound semiconductor layer,
   wherein a concentration of an n-type impurity in the n-type guide layer is at least three times as high as a concentration of an n-type impurity in the n-type cladding layer,
   wherein the n-type guide layer has a band gap larger than a band gap of the n-type cladding layer.

2. A laser diode comprising:
   an n-type guide layer between an n-type cladding layer and an undoped i-type guide layer, the undoped i-type guide layer is between an active layer and the n-type guide layer; and
   a buffer layer between a substrate and the n-type cladding layer,
   wherein a concentration of an n-type impurity in the n-type guide layer is greater than a concentration of an n-type impurity in the n-type cladding layer, the concentration of an n-type impurity in the n-type guide layer is greater than a concentration of an n-type impurity in the buffer layer.

3. The laser diode according to claim 2, wherein the concentration of an n-type impurity in the n-type guide layer is at least three times as high as the concentration of an n-type impurity in the n-type cladding layer.

4. The laser diode according to claim 2, wherein the n-type guide layer includes aluminum (Al), gallium (Ga) and nitrogen (N).

5. The laser diode according to claim 2, wherein the active layer includes gallium (Ga) and nitrogen (N).

6. The laser diode according to claim 2, wherein the impurity concentration of the n-type guide layer lies within a range from $3\times10^{18}$ cm$^{-3}$ to $1\times10^{21}$ cm$^{-3}$ both inclusive.

7. The laser diode according to claim 2, wherein the impurity concentration of the n-type guide layer lies within a range from $5\times10^{18}$ cm$^{-3}$ to $1\times10^{20}$ cm$^{-3}$ both inclusive.

8. The laser diode according to claim 2, wherein the n-type guide layer has a band gap narrower than a band gap of the n-type cladding layer.

9. The laser diode according to claim 2, wherein the n-type guide layer has a band gap larger than a band gap of the undoped i-type guide layer.

10. The laser diode according to claim 2, wherein the n-type guide layer has a refractive index higher than a refractive index of the n-type cladding layer.

11. The laser diode according to claim 2, wherein the substrate comprises n-type GaN.

12. The laser diode according to claim 2, wherein the concentration of an n-type impurity in the n-type guide layer is at least three times as high as the concentration of an n-type impurity in the buffer layer.

13. The laser diode according to claim 2, wherein the active layer is between a p-type compound semiconductor layer and an n-type compound semiconductor layer.

14. The laser diode according to claim 13, wherein the p-type compound semiconductor layer includes a ridge.

15. A laser diode comprising:
    an n-type guide layer between an n-type cladding layer and an undoped i-type guide layer, the undoped i-type guide layer is between an active layer and the n-type guide layer,
    wherein the n-type guide layer has a band gap larger than a band gap of the n-type cladding layer, a concentration of an n-type impurity in the n-type guide layer is greater than a concentration of an n-type impurity in the n-type cladding layer.

* * * * *